(12) United States Patent
Westlund et al.

(10) Patent No.: US 7,327,302 B2
(45) Date of Patent: Feb. 5, 2008

(54) EQUIVALENT TIME ASYNCHRONOUS SAMPLING ARRANGEMENT

(75) Inventors: Mathias Westlund, Gothenburg (SE); Peter Andrekson, Fogelsville, PA (US)

(73) Assignee: PicoSolve Inc., Fogelsville, PA (US)

( * ) Notice: Subject to any disclaimer, the term of this patent is extended or adjusted under 35 U.S.C. 154(b) by 50 days.

(21) Appl. No.: 11/351,378

(22) Filed: Feb. 10, 2006

(65) Prior Publication Data
US 2007/0188363 A1    Aug. 16, 2007

(51) Int. Cl.
*H03M 1/00* (2006.01)

(52) U.S. Cl. ............ 341/155; 341/123; 702/106; 324/121 R

(58) Field of Classification Search ......... 341/122, 341/123, 155; 702/66–68; 324/76.12–76.15, 324/76.36, 76.38, 76.58
See application file for complete search history.

(56) References Cited

U.S. PATENT DOCUMENTS

| | | | |
|---|---|---|---|
| 4,030,840 A * | 6/1977 | Lawton et al. | ............ 356/256 |
| 5,748,672 A | 5/1998 | Smith et al. | |
| 5,870,211 A | 2/1999 | Yoshida | |
| 6,229,633 B1 | 5/2001 | Roberts et al. | |
| 6,374,388 B1 | 4/2002 | Hinch | |
| 6,509,728 B1 | 1/2003 | Uchino et al. | |
| 6,564,160 B2 * | 5/2003 | Jungerman et al. | ......... 702/106 |
| 6,631,341 B2 | 10/2003 | Kameda et al. | |
| 6,677,577 B2 | 1/2004 | Otani et al. | |
| 6,700,516 B1 | 3/2004 | MacDonald | |
| 6,720,548 B2 | 4/2004 | Otani et al. | |
| 6,744,496 B2 | 6/2004 | Audouin et al. | |
| 6,756,775 B2 * | 6/2004 | Jungerman | ............ 324/121 R |
| 6,815,662 B2 | 11/2004 | Yamada et al. | |
| 6,836,620 B1 | 12/2004 | Bischoff | |
| 6,898,000 B2 | 5/2005 | Jungerman et al. | |
| 6,904,084 B2 | 6/2005 | Huang et al. | |
| 6,980,290 B2 | 12/2005 | Ohta et al. | |
| 2001/0004392 A1 | 6/2001 | Stek et al. | |

OTHER PUBLICATIONS

Noirie, L. et al., "New Transparent Optical Monitoring of the Eye and BER Using Asynchronous Under-Sampling of the Signal", Alcatel Research & Innovation, Route de Nozay, 91461 Marcoussis Cedex, France; IRISA/INRIA, Campus de Beaulieu 34042 Rennes Cedex, Francej.

Westlund, Mathias et al. "Software-Synchronized All-Optical Sampling for Fiber Communication Systems"; Journal of Lightwave Technology, vol. 23, No. 3, Mar. 2005.

* cited by examiner

*Primary Examiner*—Howard L. Williams
(74) *Attorney, Agent, or Firm*—Wendy W. Koba

(57) ABSTRACT

An asynchronous sampling arrangement utilizes sampling of both a high speed data signal and a trigger (clock) signal. The data signal may be either an optical signal or an electrical signal. The data and trigger signals are sampled in parallel by two separate gates, the gates based on the same strobe frequency. The samples corresponding to the trigger signal are then processed through an algorithm that determines the time-base related to the sampled signal. This established time-base is then used to reconstruct the sampled version of the high data rate input signal waveform.

14 Claims, 4 Drawing Sheets

EQUIVALENT TIME ASYNCHRONOUS SAMPLING ARRANGEMENT

TECHNICAL FIELD

The present invention relates to a sampling arrangement particularly well-suited for high speed data signals and, more particularly, to an equivalent time asynchronous sampling arrangement.

BACKGROUND OF THE INVENTION

Digital sampling is a technique used to visualize a time-varying waveform by capturing quasi-instantaneous snapshots of the waveform via, for example, a sampling gate. The gate is "opened" and "closed" by narrow pulses (strobes) in a pulse train that exhibit a well-defined repetitive behavior such that ultimately all parts of the waveform are sampled. Currently, state-of-the-art real-time sampling can be used to capture a waveform record consisting of a complete sequence of successive data bits up to approximately 10 Gb/s by employing a very high speed analog-to-digital (A/D) converter (up to 40 G-samples/s). The advantage of real-time sampling is that it allows visualization of the exact characteristics of a data pattern that precedes a waveform error, such as slow risetime or excessive overshoot.

With equivalent-time sampling, the sampling rate can be arbitrarily low and the bandwidth of the oscilloscope is instead limited by the implementation of the sampling gate. However, equivalent-time sampling also requires the measured waveform to be repetitive—a fundamental limitation when compared to real-time sampling. The design of equivalent-time sampling devices is complicated, particularly with respect to determining the time-base corresponding to when each sample is acquired (since a hardware trigger with high precision is required). When using "equivalent-time sequential sampling", the time-base (sweep) is generated by a hardware configuration using a trigger and a variable delay, thus determining when the next sample should be acquired. The delay is increased by a constant amount at each trigger event until the end of the sweep, and as a result the samples are acquired from each part of the waveform.

A common alternative time-base design is referred to as "equivalent-time random sampling", in which the sampling rate is set by an internal clock that is independent of the signal repetition rate. For each trigger event in this design, a set of samples is acquired with constant time separation between the samples within a given set, with the next sampled set randomly shifted relative to the first set, as a function of the random relationship between the waveform trigger and the internal sampling clock. After several trigger events, the waveform is reconstructed.

More recently, efforts have gone into developing methods to calculate the sampling time-base directly from the samples acquired from the waveform. In particular, an algorithm is applied to a batch of samples acquired from the waveform being measured. The algorithm uses the spectral properties of the samples (by applying a Fourier transform) to find the relationship between the sampling rate and the waveform repetition frequency required to define the time-base of the sampled waveform. As a result, the sampling time-base can be determined without requiring a trigger signal. However, this technique has a few important drawbacks associated with the fact that no trigger signal is used. First, when a data signal is time-division-multiplexed (TDM) from a lower bit rate to a higher bit rate (such as, for example, from 10 Gb/s to 40 Gb/s), this prior art technique can only synchronize the samples relative to the higher bit rate (the sub-rate information thus being lost, with no way of distinguishing one channel from another). Additionally, waveform temporal drift relative to a trigger signal can no longer be visualized (where such drift tends to occur as a function of the optical transmission distance).

Thus, a need remains in the art for an arrangement capable of sampling high data rate pulses that utilizes a trigger signal (and thus retains the additional information mentioned above), but is not hampered in design by the conventional trigger signal requirements.

SUMMARY OF THE INVENTION

The needs remaining in the prior art are addressed by the present invention, which relates to a sampling arrangement particularly well-suited for high speed data signals and, more particularly, to an equivalent-time asynchronous sampling arrangement.

In accordance with the present invention, a sampling arrangement utilizes two separate sampling gates so as to enable sampling of both the repetitive signal waveform being measured and the corresponding trigger (clock) signal. The waveform and trigger signals are sampled in parallel by two separate gates, the gates utilizing the same strobe frequency, $f_s$, to acquire the samples. The samples corresponding to the trigger signal are then processed by an algorithm that determines the time-base related to the sampled trigger signal. This established time-base is then used as the time-base of the waveform to be visualized.

It is an aspect of the present invention that the utilization of samples of the trigger signal to establish the data signal time-base is equally applicable to high data rate electrical signals as high data rate optical signals.

Additionally, when utilizing optical data rate signals, an embodiment of the present invention is capable of sampling multiple waveforms (with an associated multiplicity of trigger signals) off of a single optical strobe source.

Other and further aspects and embodiments of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
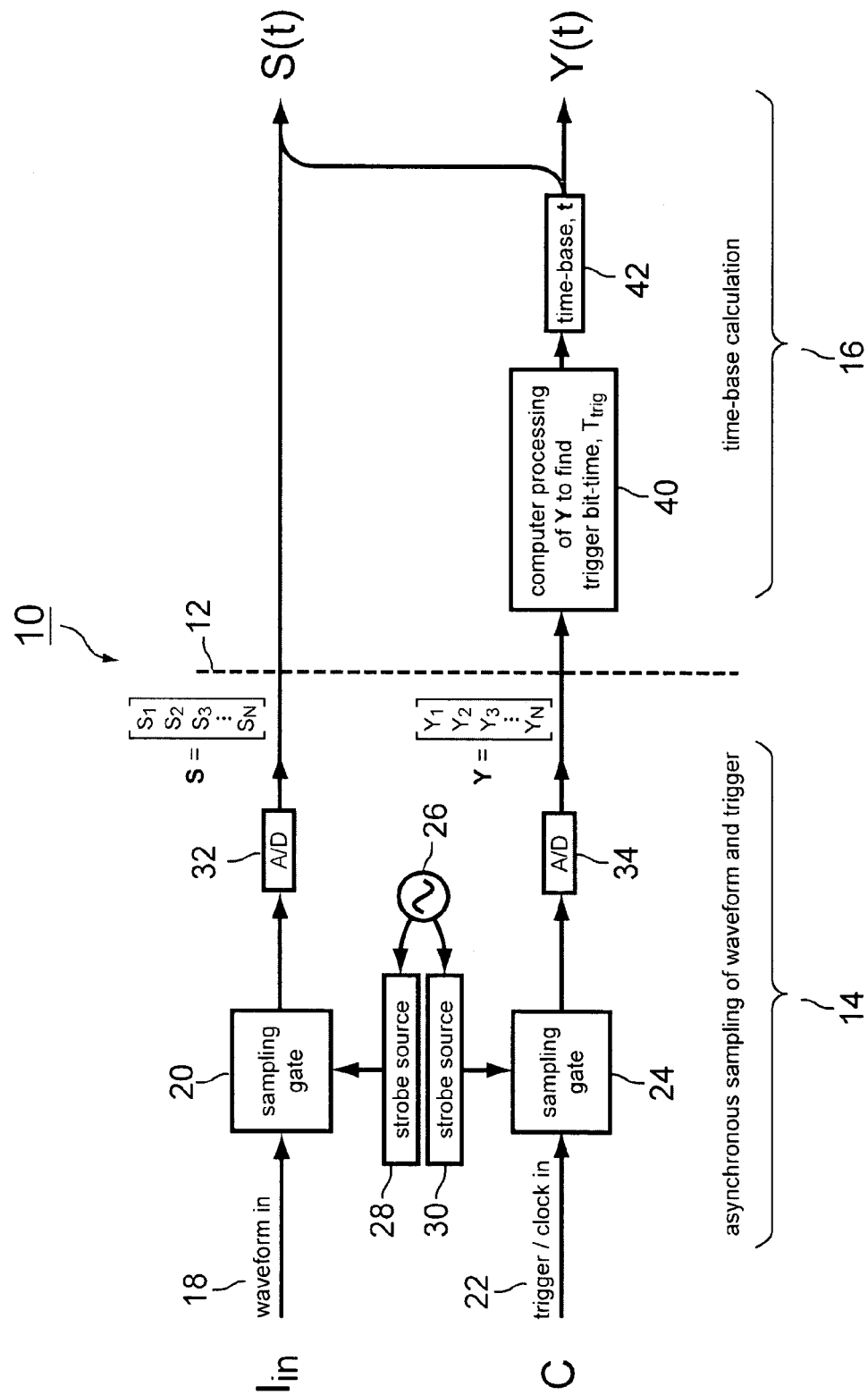
FIG. 1 contains an illustration of an exemplary arrangement for performing sampling in accordance with the present invention.

FIG. 1 illustrates an exemplary high bit rate sampling arrangement 10 formed in accordance with the present invention. The portion of arrangement 10 to the left of dotted line 12 comprises a sampling module 14 used to perform the sampling of both the input data signal and the trigger signal.

The portion of arrangement 10 to the right of dotted line 12 comprises a time-base formation module 16 based on processing of the trigger samples in accordance with the present invention. Sampling module 14 comprises a first input signal path 18 that couples the incoming repetitive waveform $I_{in}$ into a first sampling gate 20, where repetitive waveform $I_{in}$ is defined as having a predetermined bit rate B. A trigger/clock signal C is provided along a second input signal path 22 and applied as an input to a second sampling gate 24, where trigger signal C may possess a lower repetition rate than input signal $I_{in}$. In its most general case, these input signals may be either electrical signals or optical signals.

First sampling gate 20 proceeds to sample input signal $I_{in}$ at a frequency $f_s$, determined by an internal clock 26 that drives a strobe input 28 to first sampling gate 20. As shown, trigger signal C is sampled at the same frequency $f_s$ since the same clock source 26 is used to drive a strobe input 30 that is used to "open" and "close" second sampling gate 24. The analog, sampled output signal from first sampling gate 20 is thereafter passed through a first A/D converter 32 to form a digital representation of the sampled signal as a series of samples ($S_1, S_2, S_3, \ldots$ and so on) collected as a vector S of N samples. FIG. 2(a) contains a timing diagram illustrating both the analog input repetitive waveform $I_{in}$ and a series of output digitized samples $S_1, S_2, S_3, \ldots, S_9$. Illustrated in this timing diagram is the bit rate, B of the original input signal as well as the time between adjacent samples (the inverse of the sampling frequency $f_s$).

Figure 2:
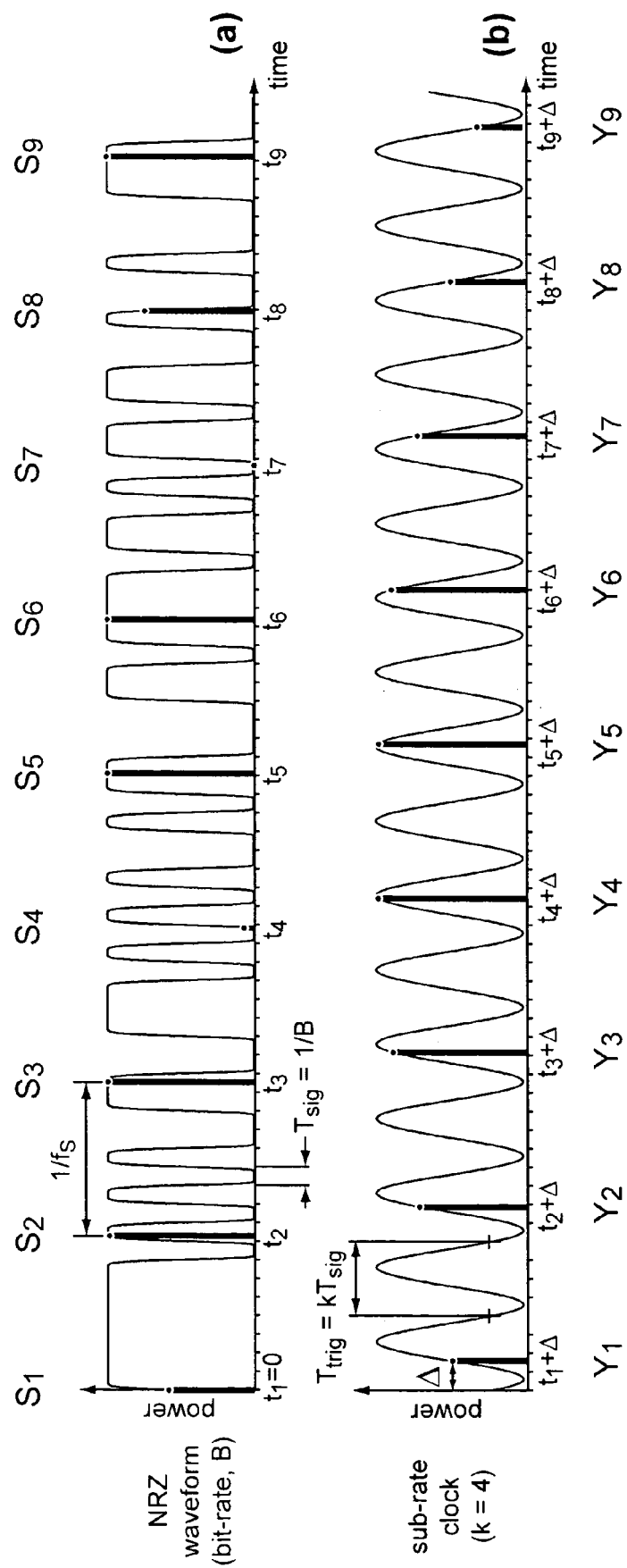
FIG. 2 is a timing diagram associated with the arrangement of FIG. 1.

In a similar manner, second sampling gate 24 generates an analog sampled version of the input trigger signal, which is thereafter passed through a second A/D converter 34 to generate a vector Y of N trigger samples $Y_1, Y_2, \ldots, Y_N$. FIG. 2(b) contains a timing diagram illustrating both the input analog trigger signal and the sampled output version, where as shown in FIG. 2 there may be a slight offset $\Delta$ between the operation of first sampling gate 20 and second sampling gate 24.

Once the vectors of sample values for both $I_{in}$ and C have been created, the arrangement of the present invention is employed by applying a known algorithm to the trigger samples so as to "software synchronize" the samples of the trigger signal to the original trigger waveform. Since the original trigger has the same time-base as waveform $I_{in}$ (by virtue of sampling gates 20 and 24 being synchronized), the time-base for the waveform samples will also be the same. In particular, processor 40 functions to calculate the "scanning step", $\Delta t$, which indicates the change in sampling time between two consecutive samples relative to the trigger period, $T_{trig}$, which is given as an input to processor 40 by the system user. After $\Delta t$ is determined, the time-stamp of each sample, $t_i$, can be established using the following relation;

$$t_i = t_{i-1} + (M^* T_{trig}) + \Delta t,$$

where M is defined as the nearest integer to $1/(f_s^* T_{trig})$—indicating the number of trigger periods that pass by between two consecutive acquired samples, and "i" indicates the sample number. In most cases, M must be known in advance, thus requiring that $T_{trig}$ and $f_s$ be estimated in advance. After successful synchronization, the exact value of $f_s$ is an output of processor 40, and is given by $1/f_s = (M^* T_{trig}) + \Delta t$. By knowing the value of $\Delta t$, the proper time stamp, $t_i$, can be applied to each of the trigger samples, with a time relative to the trigger period. As a result, a time-base vector t, corresponding to the vector of trigger samples Y can be established by time-base element 42. This time-base t is then applied to both sampled waveform S and trigger Y, as shown in FIG. 1, to reconstruct sampled signals S(t) and Y(t). Reconstructed trigger signal Y(t) can then be used to evaluate the frequency and phase variations of the trigger itself, and separate these variations from variations associated with waveform S(t). Indeed, it is to be noted that the sample-to-sample timing jitter on the trigger signal will not influence the timing jitter of the reconstructed waveform S(t) (since the calculated $\Delta t$ is averaged over many samples), where this jitter may be associated with (for example) a clock-recovery circuit. Accordingly, and contrary to a traditional hardware trigger solution, the technique of the present invention does not add jitter to S(t) as a result of any jitter present on the trigger signal.

It is an aspect of the present invention that the implementation of trigger signal processing to derive the time base t is independent of the type of sampling performed within module 14. For example, electrical sampling gates, optical sampling gates and electro-optical sampling gates may all be used, each implemented in a variety of different ways. Indeed, first and second sampling gates 20 and 24 may be the same "type" of gate, or may be of different forms, as a function of the signals applied as inputs thereto.

Figure 3:
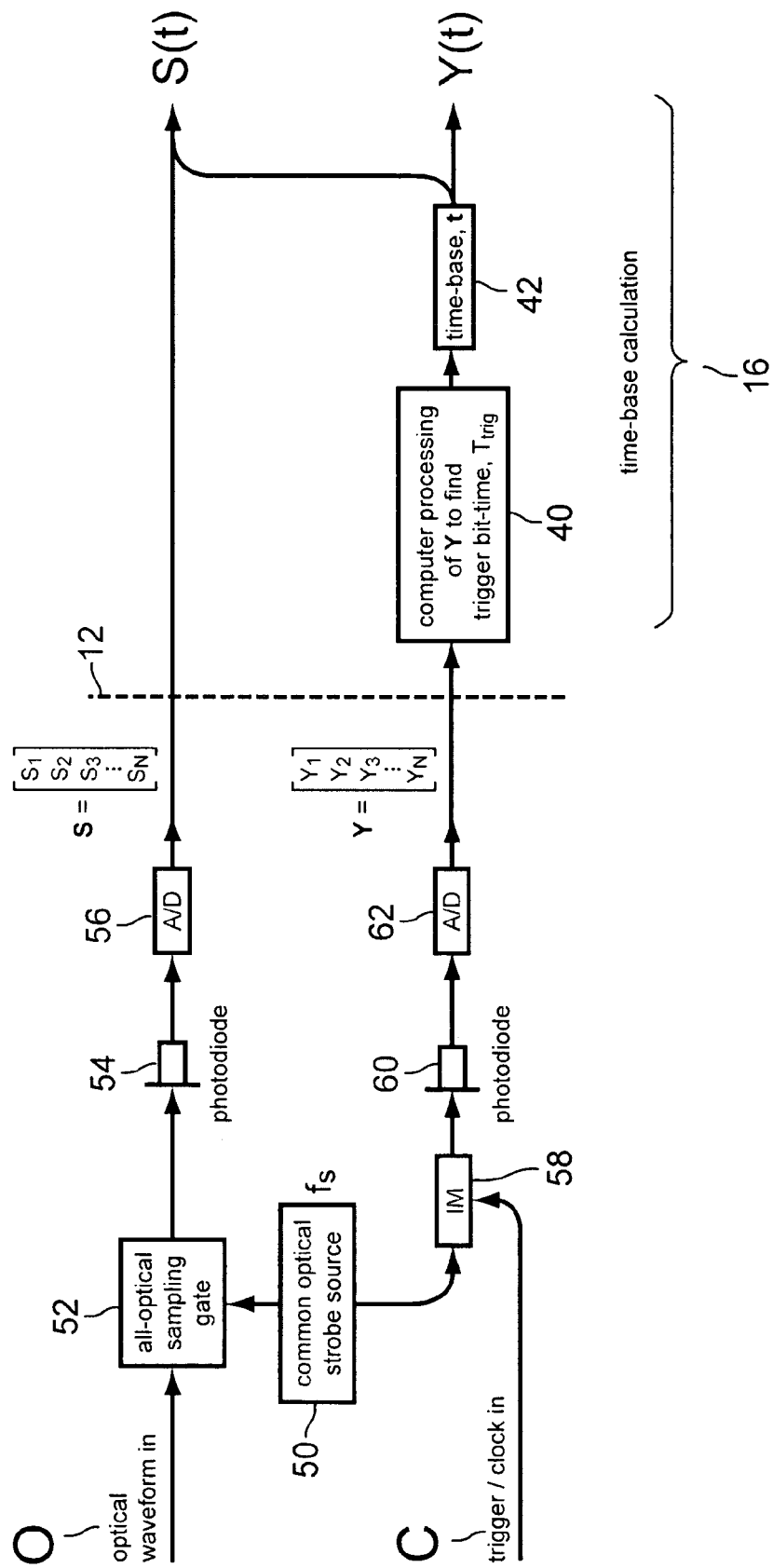
FIG. 3 illustrates an alternative embodiment of the present invention utilizing an optical input signal and an electrical trigger signal, using a common optical strobe source for both signals.

In particular, FIG. 3 illustrates an alternative embodiment of the present invention that utilizes an optical input signal as the repetitive waveform (O) and a corresponding electrical trigger signal C. In this specific embodiment, it is shown that a common strobe (optical pulse) source 50 is used as the "gating" input for both signal paths. The optical pulses from strobe source 50 do not necessarily require external synchronization to set the repetition rate and, therefore, the sampling rate can be determined by strobe source 50 itself. As will be discussed below in association with FIG. 4, the ability to utilize a common strobe source 50 will allow for an array of input data signals to be sampled and processed using a single strobe source.

Input repetitive optical signal O is applied as an input to an all-optical sampling gate 52, which is controlled by the optical strobe pulses from strobe source 50. As with the arrangement described above, the sampled output from gate 52 is determined to be a stream of analog signal pulses, exiting gate 52 with a known frequency $f_s$. The generated samples are then detected by a photodiode 54 and converted into an equivalent analog electrical signal. The analog signal is then applied as an input to a first A/D converter 56 to form a digitized sequence of signal samples, collected (as before) to form a vector S of N samples.

In this particular embodiment, an intensity modulator 58 is utilized as an electro-optical sampling gate with input (electrical) trigger signal C. The optical sampling pulses from source 50 pass through intensity modulator 58 and are attenuated in proportion to the voltage of trigger signal C. As a result, optical samples of the trigger signal are generated and are detected by a photodiode 60 to form analog electrical signals. A second A/D converter 62 is used to digitize the electrical signals, forming the vector Y of trigger signal samples.

The vector Y is thereafter applied as an input to processor 40 which, as described above, processes the samples of Y to find the trigger bit-time $T_{trig}$, and then the time-base t. As before, time-base t is used to reconstruct both repetitive waveform S(t) and trigger signal Y(t).

As mentioned above, it is an advantage of the present invention that a single strobe source may be used to control a number of trigger signals each used with a separate one of a plurality of input signals. Such an arrangement allows for sampling of, for example, an array of optical signals as employed in dense wavelength division multiplexed (DWDM) systems. Indeed, in optical-based sampling systems, the strobe source is a complex and expensive part of the hardware. Therefore, the ability to provide sampling for a plurality of high data rate signals with only a single strobe source is considered as a significant improvement.

Figure 4:
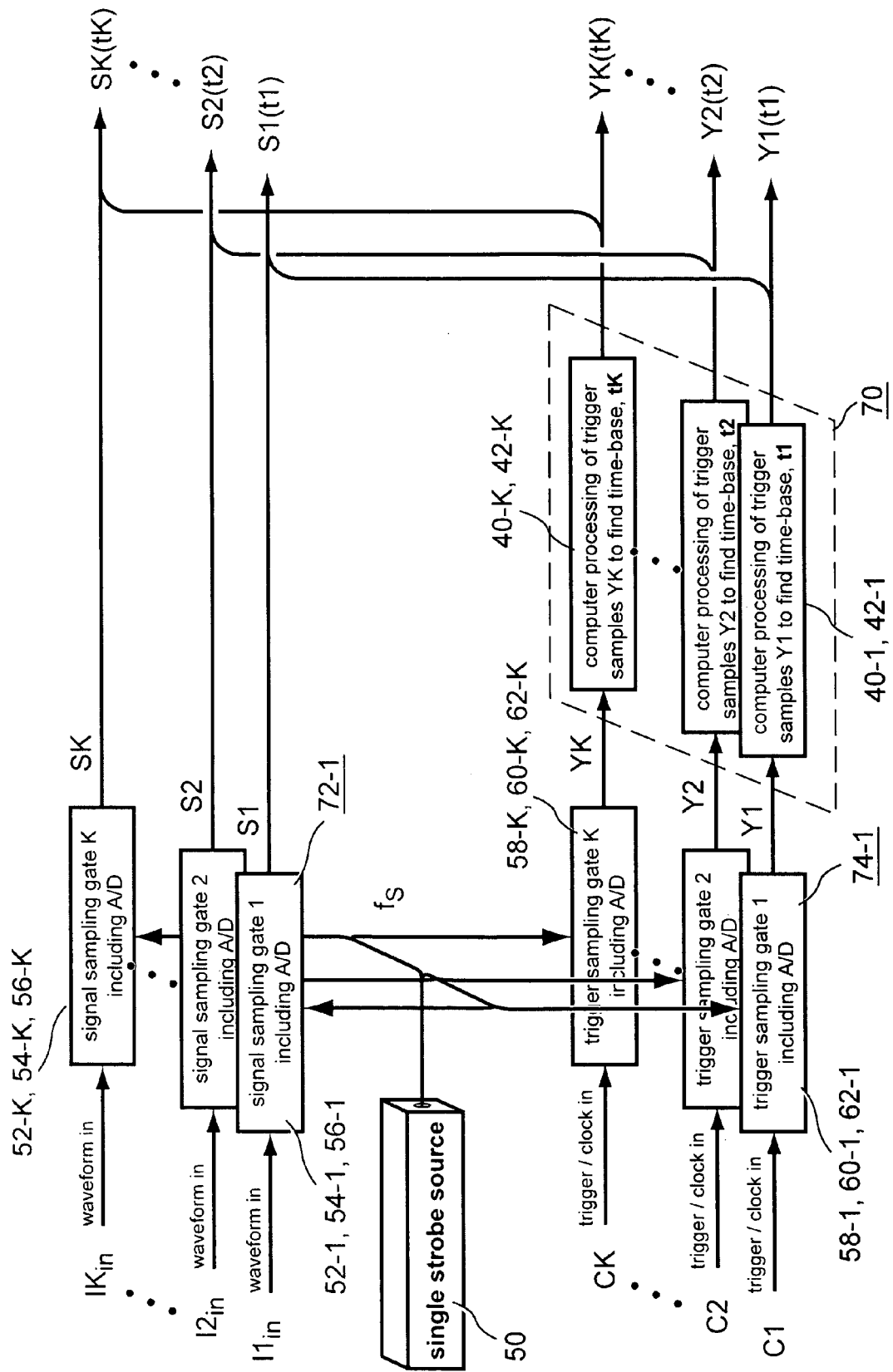
FIG. 4 illustrates an embodiment of the present invention using a plurality of separate input high data rate optical signals (and trigger signals) that require only a single optical strobe source to control the plurality of trigger signals.

FIG. 4 illustrates the use of strobe source 50 in a manner similar to that as shown in FIG. 3. In this case, however, a plurality of separate input signals $O_{in}$-1, $O_{in}$-2, ..., $O_{in}$-k are defined as a set of high data rate signals that are required to be sampled and processed. A separate trigger (clock) signal C-1, C-2, ... C-k is shown in FIG. 4 as utilized to control the input signals, where the trigger signals are paired with the data signals in a one-to-one relationship. For the purposes of illustration the separate components associated with the processing of the signals, as illustrated in FIG. 3, have been combined and illustrated as a single element in FIG. 4. That is, gate 52, photodiode 54 and A/D converter 56 associated with input optical data signal O from FIG. 1 are combined and illustrated as element 72 in FIG. 4. As shown, then, input optical data signal $O_{in}$-1 is applied as a first input to element 72-1, with the output from strobe source 50 applied as the gating input to element 72-1. The output from element 72-1, in a similar manner as shown in FIG. 3, will be a series of digitized representations of input optical signal samples.

The output from strobe source 50 is also applied as the gating input for each separate trigger signal. As before, the various elements associated with the initial gating of the trigger signal (e.g., intensity modulator 58, photodiode 60 and A/D converter 62) have all been combined in the illustration of FIG. 4 and shown as a single element 74. There, a first trigger signal C-1 is applied as an input to element 74-1, with the strobe signal from source 50 applied as the gating input for element 74-1. The sampled trigger signal output from element 74-1 is thereafter applied as an input to element 76-1, which represents the combination of processor 40 and time-base module 42 as described above in association with FIG. 3. As shown, the gating and sampling of both the optical input signals and trigger signals occurs simultaneously for the entire plurality of signals. Indeed, the trigger signal samples (denoted as Y-1, Y-2, ..., Y-k in FIG. 4) may be applied as separate inputs to a single processing arrangement 70, which may serve as another reduction in the overall size and complexity of the required system.

It is to be understood that other advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the claims appended hereto.

What is claimed is:

1. An asynchronous sampling arrangement comprising
a first sampling gate responsive to an input time-varying waveform to form a sampled time-varying waveform;
a second sampling gate responsive to an input trigger signal to form a sampled trigger signal having a trigger period $T_{trig}$;
a strobe source for controlling the first and second sampling gates at a frequency $f_s$;
a first analog-to-digital (A/D) converter coupled to the output of the first sampling gate to convert a set of analog samples from the input time-varying waveform into a digital representation thereof;
a second analog-to-digital (A/D) converter coupled to the output of the second sampling gate to covert a set of analog samples from the input trigger signal into a set of digital trigger samples;
a processor responsive to the set of trigger samples to determine therefrom a scanning step $\Delta t$, indicative of a change in sampling time between two consecutive samples relative to the trigger $T_{trig}$; and
a time base module for establishing a time base t from the calculated $\Delta t$ by establishing a time-stamp $t_i$ for each sample in the set of digital trigger samples using the relation $t_i = t_{i-1} + (M^*T_{trig}) + \Delta t$, where M is an integer indicating the number of trigger periods that pass between two consecutive acquired samples the established time base t thereafter applied to the digital representation of the sampled signal waveform to form a reconstructed versions thereof.

2. An asynchronous sampling arrangement as defined in claim 1 wherein the strobe source comprises a pair of separate synchronized strobe components used to control the first and second gates, respectively.

3. An asynchronous sampling arrangement as defined in claim 2 wherein the pair of separate synchronized strobe components are both optical components.

4. An asynchronous sampling arrangement as defined in claim 2 wherein the pair of separate synchronized strobe sources are both electrical strobe components.

5. An asynchronous sampling arrangement as defined in claim 2 wherein one strobe component is an optical strobe component and one strobe component is an electrical strobe component.

6. An asynchronous sampling arrangement as defined in claim 1 wherein the first and second sampling gates are selected from the group consisting of: optical sampling gates, electrical sampling gates, opto-electronic sampling gates and any combination thereof.

7. An asynchronous sampling arrangement as defined in claim 1 wherein the calculated scanning step $\Delta t$ varies over a set of N samples due to changes in the relation between $1/T_{trig}$ and $f_s$ as a function of time.

8. An asynchronous sampling arrangement as defined in claim 1 wherein the input signal comprises an optical input waveform and the first sampling gate comprises a first optical sampling gate.

9. An asynchronous sampling arrangement as defined in claim 8 wherein the input trigger signal is electrical and the second sampling gate comprises an opto-electronic sampling gate, the first and second sampling gates controlled by a common optical source.

10. An asynchronous sampling arrangement as defined in claim 9 wherein the opto-electronic sampling gate is implemented in the form of an optical intensity modulator followed by a photodiode which converts the optical samples to the electrical domain.

11. An arrangement for performing asynchronous sampling for a plurality of time-varying waveforms, the arrangement comprising
a first plurality of sampling gates, each responsive to a separate one of the plurality of time-varying waveforms, the first plurality of sampling gates providing as an output a plurality of sampled time-varying waveforms;
a second plurality of sampling gates, each responsive to a separate one of a plurality of input trigger signals, the second plurality of sampling gates providing as an output a plurality of sampled trigger, signals;

a strobe source coupled to the first and second pluralities of sampling gates for providing control pulses at a frequency $f_s$ to each sampling gate;

a processor responsive to the plurality of sampled trigger signals to determine therefrom a plurality of scanning steps $\Delta t$, indicative of a change in sampling time between two consecutive samples relative to the corresponding trigger $T_{trig}$; and a time base module for establishing a plurality of time bases t from the calculated $\Delta t$ by establishing a time-stamp $t_i$ for each sample in each set of digital trigger samples using the relation $t_i = t_{i-1} + (M*T_{trig}) + \Delta t$, where M is an integer indicating the number of trigger periods that pass between two consecutive acquired samples each separate established time base t thereafter applied to its associated digital representation of the sampled data signal to form a reconstructed versions thereof.

12. An arrangement for performing asynchronous sampling for a plurality of time-varying waveforms as defined in claim 11 wherein the plurality of input signal and trigger signal pairs have different repetition rates and are simultaneously reconstructed with separate time bases t.

13. An arrangement for performing asynchronous sampling for a plurality of time-varying waveforms as defined in claim 11 wherein one or more trigger signals and the associated time bases t are used to reconstruct more than one input signal for each trigger signal operating at the same repetition rate.

14. An arrangement for performing asynchronous sampling for a plurality of time-varying waveforms as defined in claim 11 where the strobe source comprises a plurality of separate strobe components selected from the group consisting of: optical strobe components, electrical strobe components, opto-electronic strobe components and any combination thereof, the plurality of separate strobe components being any appropriate number of separate components ranging from a pair of strobe components to a plurality of strobe components equal to the plurality of input time-varying waveforms.

* * * * *